United States Patent
Matsumura et al.

(10) Patent No.: US 7,429,522 B2
(45) Date of Patent: Sep. 30, 2008

(54) DICING DIE-BONDING FILM

(75) Inventors: Takeshi Matsumura, Ibaraki (JP);
Masayuki Yamamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/947,727

(22) Filed: Nov. 29, 2007

(65) Prior Publication Data

US 2008/0088036 A1 Apr. 17, 2008

Related U.S. Application Data

(62) Division of application No. 11/012,998, filed on Dec. 15, 2004, now Pat. No. 7,309,925.

(30) Foreign Application Priority Data

Dec. 26, 2003 (JP) ............... 2003-431690

(51) Int. Cl.
- *H01L 21/78* (2006.01)
- *H01L 21/46* (2006.01)
- *H01L 21/301* (2006.01)
- *H01L 21/76* (2006.01)
- *H01L 23/544* (2006.01)
- *H01L 21/768* (2006.01)
- *H01L 21/44* (2006.01)

(52) U.S. Cl. ............ 438/462; 438/401; 438/110; 438/113; 438/458; 438/114; 257/797; 257/620; 257/E23.179; 257/E21.596; 257/E21.599

(58) Field of Classification Search ......... 438/401, 438/462, 110, 113, 114, 458; 257/797, 620, 257/E21.596, E21.599, E23.179
See application file for complete search history.

(56) References Cited

U.S. PATENT DOCUMENTS

| | | | |
|---|---|---|---|
| 4,664,739 | A | 5/1987 | Aurichio |
| 4,687,693 | A | 8/1987 | Sheyon et al. |
| 4,961,804 | A | 10/1990 | Aurichio |
| 5,098,501 | A | 3/1992 | Nishiguchi |

(Continued)

FOREIGN PATENT DOCUMENTS

EP  0 150 882 A1  8/1985

(Continued)

OTHER PUBLICATIONS

Chinese Office Action issued on the corresponding/ related Chinese Patent Application No. 200410098297.6, dated Sep. 28, 2007.

(Continued)

*Primary Examiner*—Luan Thai
(74) *Attorney, Agent, or Firm*—Knobbe Martens Olson & Bear LLP

(57) ABSTRACT

A dicing die-bonding film has a supporting substrate, an adhesive layer formed on the supporting substrate, and a die-bonding adhesive layer formed on the adhesive layer, and further has a mark for recognizing the position of the die-bonding adhesive layer. It is possible to provide a dicing die-bonding film in which in the case a semiconductor wafer and the dicing die-bonding film are stuck onto each other, the position of the die-bonding adhesive layer in the film can be recognized.

18 Claims, 9 Drawing Sheets

U.S. PATENT DOCUMENTS

| | | | |
|---|---|---|---|
| 5,304,418 | A | 4/1994 | Akada et al. |
| 5,476,565 | A | 12/1995 | Akada et al. |
| 5,525,422 | A | 6/1996 | Spies et al. |
| 5,705,016 | A | 1/1998 | Senoo et al. |
| 5,844,348 | A | 12/1998 | Gamo |
| 5,888,606 | A | 3/1999 | Senoo et al. |
| 6,007,920 | A | 12/1999 | Umehara et al. |
| 6,140,151 | A | 10/2000 | Akram |
| 6,171,163 | B1 | 1/2001 | Seko et al. |
| 6,245,593 | B1 | 6/2001 | Yoshihara et al. |
| 6,258,426 | B1 | 7/2001 | Yamamoto et al. |
| 6,398,892 | B1 | 6/2002 | Noguchi et al. |
| 6,457,220 | B1 | 10/2002 | Hamano |
| 6,528,330 | B2 * | 3/2003 | Iketani ............ 438/14 |
| 6,548,327 | B2 | 4/2003 | De Pauw et al. |
| 6,938,783 | B2 | 9/2005 | Chung |
| 6,977,024 | B2 | 12/2005 | Yamazaki et al. |
| 7,054,161 | B1 | 5/2006 | James |
| 7,060,339 | B2 | 6/2006 | Matsumura et al. |
| 7,147,920 | B2 | 12/2006 | Shiobara et al. |
| D549,189 | S | 8/2007 | Misumi et al. |
| 7,309,925 | B2 | 12/2007 | Matsumura et al. |
| 2002/0001670 | A1 | 1/2002 | Pauw et al. |
| 2002/0014465 | A1 | 2/2002 | Chung |
| 2002/0042189 | A1 | 4/2002 | Tanaka |
| 2003/0207479 | A1 | 11/2003 | Border et al. |
| 2003/0226640 | A1 | 12/2003 | Yamazaki et al. |
| 2004/0105990 | A1 | 6/2004 | Shiobara et al. |
| 2004/0241910 | A1 | 12/2004 | Matsumura et al. |
| 2005/0046042 | A1 | 3/2005 | Matsumura et al. |
| 2005/0139973 | A1 | 6/2005 | Matsumura et al. |
| 2005/0208736 | A1 | 9/2005 | Matsumura et al. |
| 2005/0224978 | A1 | 10/2005 | Kawate et al. |
| 2006/0029762 | A1 | 2/2006 | Chung |
| 2006/0257651 | A1 | 11/2006 | Shintani |

FOREIGN PATENT DOCUMENTS

| | | |
|---|---|---|
| EP | 0 134 606 B1 | 3/1989 |
| EP | 0 550 014 A2 | 7/1993 |
| EP | 0 571 649 A1 | 12/1993 |
| EP | 0 588 180 A1 | 3/1994 |
| EP | 0 786 802 A2 | 7/1997 |
| EP | 0 792 756 A2 | 9/1997 |
| EP | 0 884 766 A2 | 12/1998 |
| EP | 0 976 802 A1 | 2/2000 |
| EP | 1 411 547 A2 | 4/2004 |
| EP | 1 482 546 A2 | 12/2004 |
| GB | 2 340 772 A | 3/2000 |
| JP | 60-57642 | 4/1985 |
| JP | 60-196956 | 10/1985 |
| JP | 61-263136 | 11/1986 |
| JP | 62-079649 | 4/1987 |
| JP | 1-268131 | 10/1989 |
| JP | 2-248064 | 10/1990 |
| JP | 2-265258 | 10/1990 |
| JP | 4-042555 | 2/1992 |
| JP | 5-078629 | 3/1993 |
| JP | 7-263382 | 10/1995 |
| JP | 8-213349 | 8/1996 |
| JP | 10-335271 | 12/1998 |
| JP | 11-111162 | 4/1999 |
| JP | 2002-158276 | 5/2002 |
| JP | 2002-226800 A | 8/2002 |
| JP | 2003-119438 | 4/2003 |
| JP | 2003-206468 A | 7/2003 |
| JP | 2003-316031 A | 11/2003 |
| JP | 2003-56248 | 9/2004 |
| JP | 2004-349510 | 12/2004 |

OTHER PUBLICATIONS

European Search Report issued on the related European Patent Application No. EP04012260, dated Jan. 4, 2005.

Japanese Office Action issued on the corresponding/relating Japanese Patent Application No. 2003-431690, dated Oct. 30, 2007.

Decision of Refusal issued on the related Japanese Patent Application No. 2003-152659, dated Oct. 30, 2007.

European Search Report issued on the related European Patent Application No. EP05005884, dated Jun. 14, 2006.

European Search Report issued on the related European Patent Application No. EP03023536, dated Jul. 27, 2004.

European Search Report issued on the related European Patent Application No. 03023536, dated Aug. 9, 2004.

File History of the related U.S. Appl. No. 11/082,112, as of Nov. 30, 2007.

File History of the related U.S. Appl. No. 11/369,931, as of Nov. 30, 2007.

File History of the related U.S. Appl. No. 11/671,982, as of Nov. 30, 2007.

File History of the related U.S. Appl. No. 29/225,424, as of Nov. 30, 2007.

Japanese Office Action issued on the related Japanese Patent Application No. 2003-431690, dated Jun. 26, 2007.

Japanese Patent Office Action issued on the related Japanese Patent Application No. 2003-431690, dated Jan. 18, 2007.

Notification of Reasons for Refusal issued on the related Japanese Patent Application No. 2003-152659, dated Sep. 27, 2006.

Written Opinion issued by the Austrian Patent Office on the related Singapore Patent Application No. 200402611-8, dated Apr. 13, 2007.

File History of the related U.S. Appl. No. 10/849,414, as of Nov. 30, 2007.

* cited by examiner

DICING DIE-BONDING FILM

CROSS-REFERENCE TO PRIORITY AND RELATED APPLICATIONS

This application is a divisional application of U.S. patent application Ser. No. 11/012,998, filed Dec. 15, 2004, which claims priority to Japanese Patent Application No. 2003-431690, filed Dec. 26, 2003. This application also is related to U.S. patent application Ser. No. 10/678,855, filed Oct. 3, 2003, now issued U.S. Pat. No. 7,060,339; U.S. patent application Ser. No. 11/369,931, filed Mar. 7, 2006; U.S. patent application Ser. No. 10/849,414, filed May 19, 2004; U.S. patent application Ser. No. 11/671,982, filed Feb. 6, 2007; U.S. patent application Ser. No. 29/225,423, filed Mar. 16, 2005, now issued U.S. Pat. No. D549189; U.S. patent application Ser. No. 29/225,424, filed Mar. 16, 2005; and U.S. patent application Ser. No. 11/082,112, filed Mar. 16, 2005.

FIELD OF THE INVENTION

The present invention relates to a dicing die-bonding film for supplying, to the dicing of a work (such as a semiconductor wafer), an adhesive for fixing a chip-form work (such as a semiconductor chip) and an electrode member to each other in the state that the adhesive is attached to the work before the dicing. The present invention also relates to a method for fixing a chip-form work, using the dicing die-bonding film, and further relates to a semiconductor device to which a chip-form work is bonded and fixed by this fixing method.

BACKGROUND OF THE INVENTION

A semiconductor wafer wherein a circuit pattern is formed is adjusted into an appropriate thickness by polishing the rear face thereof if necessary, and then the wafer is diced into chips (the dicing step). In order to remove the resultant cut layer in this step, the semiconductor wafer is generally washed with a liquid in which an appropriate fluid pressure (usually, about 2 kg/cm$^2$) is given. Next, one of the chip-form works is stuck/fixed onto an object wherein the work is to be stuck/fixed, such as a lead frame, with an adhesive (the mounting step). Thereafter, the resultant is forwarded into the bonding step. In the mounting step, the adhesive is applied onto the lead frame or the chip-form work. In this method, however, the adhesive layer is not easily made uniform and further an especial device or a long time is required for the application of the adhesive. For this reason, there is suggested a dicing film for sticking and holding a semiconductor wafer in the dicing step and further for giving a chip-bonding adhesive layer necessary for the mounting step (see, for example, JP-A-60-57642).

According to the JP-A-60-57642, the dicing film is a film wherein an electroconductive adhesive layer is peelably deposited on a supporting substrate. According to this dicing film, a semiconductor wafer held by the adhesive layer is diced, and then the supporting substrate is extended to peel the chip-form works together with the adhesive layer. These works are individually collected and then one or more of the works are stuck/fixed onto an object on which the work(s) is/are to be stuck/fixed, such as a lead frame, through the adhesive layer.

In such a dicing die-bonding film, its adhesive layer is stuck only onto a semiconductor wafer and the other portion is stuck onto a dicing frame. However, there remains a problem that the portion which is stuck onto the semiconductor wafer and the portion which is stuck onto the dicing frame cannot be peeled.

SUMMARY OF THE INVENTION

An object of the present invention is to provide a dicing die-bonding film making it possible that when a semiconductor wafer is stuck to the film, the position of a die-bonding adhesive layer of the film can be recognized. Another object of the invention is to provide a dicing die-bonding film superior in the balance between the holding force generated when a work is diced and peelability necessary when a chip-form work obtained by the dicing is peeled together with a die-bonding adhesive layer of the film.

Still another object of the invention is to provide a method for fixing a chip-form work by use of the above-mentioned dicing die-bonding film. An additional object of the invention is to provide a semiconductor device to which a chip-form work is stuck/fixed by this fixing method.

The inventors have found out that a mark is beforehand arranged on a dicing die-bonding film, whereby the film can be stuck to a semiconductor wafer without causing any positional slippage, and then made further investigations fully. As a result, the present invention has been made.

Thus, a first aspect of the present invention is a dicing die-bonding film comprising a supporting substrate (1) and a die-bonding adhesive layer (3) formed on or over the supporting substrate (1), wherein a mark for recognizing the position of the die-bonding adhesive layer (3) is arranged at a given position of the film.

It is preferable that a pressure-sensitive adhesive layer (2) is formed between the supporting substrate (1) and the die-bonding adhesive layer (3).

It is also preferable that the mark is arranged on a portion of the supporting substrate (1) or the pressure-sensitive adhesive layer (2) on which the die-bonding adhesive layer (3) is not formed. The wording "the mark is arranged on a portion of the supporting substrate (1)" has a meaning including the case that the position-recognizing mark is arranged on the rear face of the supporting substrate (1), on which the die-bonding adhesive layer (3) is not formed, and the case that the position-recognizing marks are arranged on both surfaces of the supporting substrate (1).

It is also preferable that the mark is arranged at a position to which a work and a mount frame are not attached.

It is also preferable that the mark is arranged at a position remaining after a mount frame is formed.

It is also preferable that two or more marks are arranged at given positions on a straight line. This is because when the plural marks are arranged at the given positions on the straight line, the precision for recognizing the marks with a sensor set to be fixed is improved.

It is also preferable that about the peelability of the interface between the pressure-sensitive adhesive layer (2) and the die-bonding adhesive layer (3) between an interface face (A) corresponding to a work-attaching area (3a) of the die-bonding adhesive layer (3) and an interface (B) corresponding to a portion or the entire of other area (3b) than the area (3a), and the peelability of the interface (A) is larger than that of the interface (B).

It is also preferable that the adhesive force of the pressure-sensitive adhesive layer (2) to the die-bonding adhesive layer (3) is different between a portion (2a) corresponding to the work-attaching area (3a) of the die-bonding adhesive layer (3) and a portion (2b) corresponding to a portion or the entire of the other area (3b), and the adhesive force of the pressure-sensitive adhesive layer portion (2a) is smaller than that of the pressure-sensitive adhesive layer portion (2b).

It is also preferable that the adhesive force of the work-attaching area (3a) of the die-bonding adhesive layer (3) to a work is larger than the adhesive force of the work-attaching area (3a) to the pressure-sensitive adhesive layer portion (2a).

It is also preferable that a portion of the area (3b) other than the work-attaching area (3a) is a mount-frame-attaching area (3b').

It is also preferable that the adhesive force of the mount-frame-attaching area (3b') of the die-bonding adhesive layer (3) to a mount frame is smaller than the adhesive force of the mount-frame-attaching area (3b') to the adhesive layer portion (2b').

It is also preferable that the die-bonding adhesive layer (3) is provided, as the work-attaching area (3a), to a portion of the pressure-sensitive adhesive layer (2), the adhesive force of the pressure-sensitive adhesive layer (2) is different between the portion (2a) corresponding to the work-attaching area (3a) and the portion (2b) other than the portion (2a), and the adhesive force of the pressure-sensitive adhesive layer portion (2a) is smaller than that of the pressure-sensitive adhesive layer portion (2b).

It is also preferable that the adhesive force of the work-attaching area (3a) to a work is larger than that of the area (3a) to the adhesive layer area (2a).

It is also preferable that the pressure-sensitive adhesive layer (2) is made of a radial ray curable adhesive, and the adhesive layer area (2a) corresponding to the work-attaching area (3a) is irradiated with a radial ray.

A second aspect of the present invention is a method for fixing a chip-form work, using a dicing die-bonding film comprising a supporting substrate (1) and a die-bonding adhesive layer (3) formed on the supporting substrate (1), a mark for recognizing the position of the die-bonding adhesive layer (3) being arranged at a given position of the film, the method comprising:

the step of pressing and bonding a work onto the die-bonding adhesive layer (3) of the dicing die-bonding film, the step being a step of recognizing the mark to detect information about the position of the die-bonding adhesive layer (3), correcting, if a positional slippage is present between the die-bonding adhesive layer (3) and the work on the basis of the position information, the positional slippage, and then pressing and bonding the die-bonding adhesive layer (3) and the work, the step of dicing the work into the chip-form work, the step of peeling the chip-form work together with the die-bonding adhesive layer (3) from the pressure-sensitive adhesive layer (2), and the step of sticking/fixing the chip-form work through the die-bonding adhesive layer (3) to a semiconductor element.

A third aspect of the present invention is a semiconductor device wherein a chip-form work is stuck/fixed through a die-bonding adhesive layer (3) to a semiconductor element by a method for fixing the chip-form work, using a dicing die-bonding film comprising a supporting substrate (1) and the die-bonding adhesive layer (3) formed on or over the supporting substrate (1), a mark for recognizing the position of the die-bonding adhesive layer (3) being arranged at a given position of the film, the method comprising:

the step of pressing and bonding a work onto the die-bonding adhesive layer (3) of the dicing die-bonding film, the step being a step of recognizing the mark to detect information about the position of the die-bonding adhesive layer (3), correcting, if a positional slippage is present between the die-bonding adhesive layer (3) and the work on the basis of the position information, the positional slippage, and then pressing and bonding the die-bonding adhesive layer (3) and the work, the step of dicing the work into the chip-form work, the step of peeling the chip-form work together with the die-bonding adhesive layer (3) from the pressure-sensitive adhesive layer (2), and the step of sticking/fixing the chip-form work through the die-bonding adhesive layer (3) to the semiconductor element.

According to the present invention, the mark for recognizing the position of the die-bonding adhesive layer (3) is arranged on the dicing die-bonding film; therefore, the position of the die-bonding adhesive layer (3) can easily be recognized even if the supporting substrate (1) or the die-bonding adhesive layer (3) is a transparent member. In this way, positional slippage can be prevented when the die-bonding adhesive layer (3) is attached onto a work so that the yield of products can be improved.

The dicing die-bonding film of the present invention can be made into a structure having the pressure-sensitive adhesive layer (2) on the supporting substrate (1) and the die-bonding adhesive layer (3) which is peelable formed on the pressure-sensitive adhesive layer (2).

The pressure-sensitive adhesive layer (2) can be designed to have the portions (2a and 2b), which correspond to the work-attaching area (3a) of the die-bonding adhesive layer (3) and the area (3b) other than the area (3a), in such a manner that the adhesive force of the pressure-sensitive adhesive layer portion (2a) to the die-bonding is adhesive layer (3) is smaller than that of the pressure-sensitive adhesive layer portion (2b) to the layer (3). In other words, the pressure-sensitive adhesive layer portion (2b) bonds to the adhesive layer (3) to an appropriate extent at the time of dicing or expanding, so that the pressure-sensitive adhesive layer (2) is not peeled from the adhesive layer (3). On the other hand, the pressure-sensitive adhesive layer portion (2a) makes easy peeling possible. Therefore, no dicing poorness is given to even a large-sized chip having a larger size than a size of 10 mm×10 mm. The obtained dicing die-bonding film is a dicing die-bonding film making it possible to easily peel and pick up the resultant chip-form work obtained after the dicing. As described above, the dicing die-bonding film (1) of the invention has a good balance between holding power at the time of dicing and other times and peelability at the time of picking-up.

In the case that the dicing die-bonding film of the invention has a structure satisfying the following relationship: the adhesive force of the work-attaching area (3a) of the die-bonding adhesive layer (3) to a work is larger than that of the work-attaching area (3a) to the pressure-sensitive adhesive layer portion (2a), the chip-form work obtained after the work is diced can easily be peeled from the pressure-sensitive adhesive layer portion (2a) in the state that the die-bonding adhesive layer (3) is attached to the chip-form work.

In the dicing die-bonding film, a portion of the area (3b) other than the work-attaching area (3a) can be made into a mount-frame-attaching area (3b'). In the case that the adhesive force of the mount-frame-attaching area (3b') of the die-bonding adhesive layer (3) to a mount frame is smaller than that of the area (3b') to the adhesive layer portion (2b'), the dicing die-bonding film has a good balance between holding power at the time of dicing and other times and peelability at the time of picking-up.

The dicing die-bonding film of the present invention can be made into a structure having the pressure-sensitive adhesive layer (2) on the supporting substrate (1) and the die-bonding adhesive layer (3) which is peelable formed as the work-attaching area (3a) on a portion of the pressure-sensitive adhesive layer (2). The pressure-sensitive adhesive layer (2) can be designed to have the portion (2a) which corresponds to the work-attaching area (3a) and the other portion (2b) in such a manner that the adhesive force of the pressure-sensitive adhesive layer portion (2a) is smaller than that of the pressure-sensitive adhesive layer portion (2b). In other words, the pressure-sensitive adhesive layer portion (2a) makes easy peeling possible. On the other hand, a wafer ring can be bonded to the pressure-sensitive adhesive layer portion (2b). This can be fixed thereto so that this is not peeled at the time of dicing or expanding. Therefore, no dicing poorness is given to even a large-sized chip having a larger size than a size of 10 mm×10 mm. The obtained dicing die-bonding film is a dicing die-bonding film making it possible to easily peel and pick up the resultant chip-form work obtained after the dicing. As described above, the dicing die-bonding film of the invention has a good balance between holding power at the time of dicing and other times and peelability at the time of picking-up.

In the case that the dicing die-bonding film of the invention satisfies the following relationship: the adhesive force of the work-attaching area (3a) to a work is larger than that of the work-attaching area (3a) to the pressure-sensitive adhesive layer portion (2a), the chip-form work obtained after the work is diced can easily be peeled from the pressure-sensitive adhesive layer portion (2a) in the state that the die-bonding adhesive layer (3a) is attached to the chip-form work.

BRIEF DESCRIPTION OF THE DRAWINGS

Other objects, features and superior points of the present invention will be sufficiently understood from the following description. The advantages of the present invention will be made clear from the following description with reference to the attached drawings.

FIG. 1(a) is a plan view of the dicing die-bonding film, and FIG. 1(b) is a sectional view of the film taken on line A-A of FIG. 1(a), which is viewed along arrows.

FIG. 7(a) is a plan view of the dicing die-bonding film, and FIG. 7(b) is a sectional view of the film taken on line B-B of FIG. 7(a), which is viewed along arrows.

DESCRIPTION OF THE EMBODIMENTS

Embodiment 1

Figure 1A:
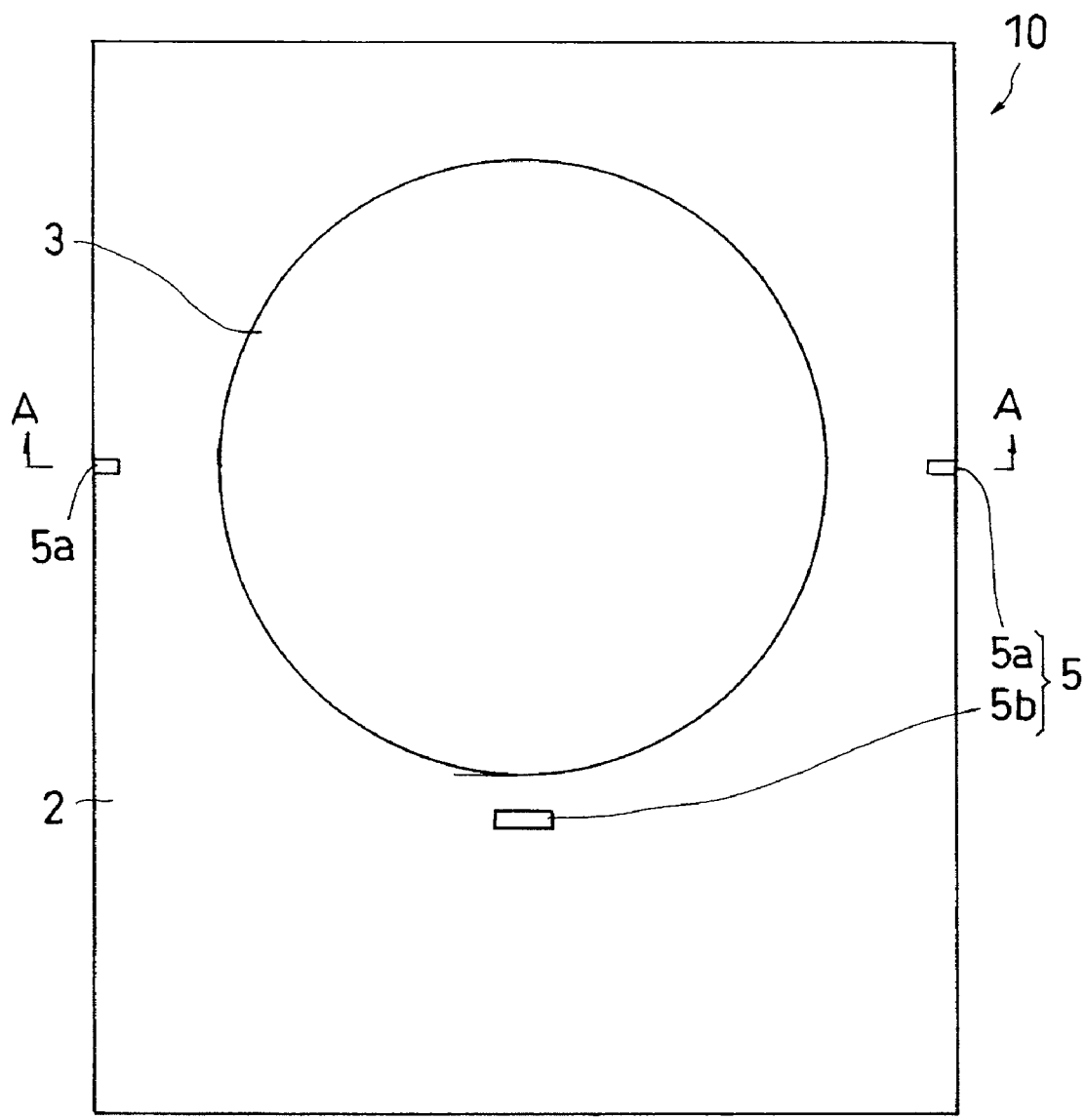
FIGS. 1(a) and 1(b) are views which schematically illustrate a dicing die-bonding film according to Embodiment 1 of the present invention.
Figure 1B:
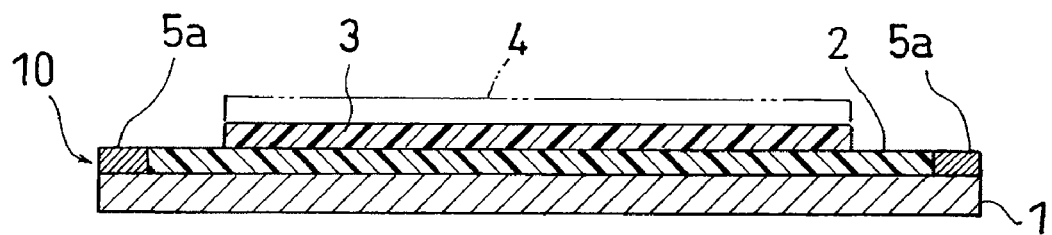

Embodiment 1 of the present invention is described hereinafter with reference to FIGS. 1(a) and 1(b). In the figures, however, parts or portions unnecessary for the description are omitted and some parts or portions are enlarged, scaled down or modified to make the description easy. The same matter is applied to the other drawings. FIG. 1(a) is a plan view of a dicing die-bonding film 10 according to the present embodiment, and FIG. 1(b) is a sectional view of the film taken on line A-A of FIG. 1(a), which is viewed along arrows.

The dicing die-bonding film 10 of the present embodiment has a structure composed of a supporting substrate 1, a pressure-sensitive adhesive layer 2 formed on the supporting substrate 1, a die-bonding adhesive layer 3 formed on the pressure-sensitive adhesive layer 2, and position-recognizing marks 5 for sticking the die-bonding adhesive layer 3 onto a semiconductor wafer (work) 4.

The supporting substrate 1 is a core member for giving strength to the dicing die-bonding film 10. Examples of the material of the supporting substrate 1 include polyolefins such as low density polyethylene, linear polyethylene, middle density polyethylene, high density polyethylene, super low density polyethylene, randomly-copolymerized polypropylene, block-copolymerized polypropylene, homopolypropylene, polybutene and polymethylpentene, ethylene/vinyl acetate copolymer, ionomer resin, ethylene/(meth)acrylic acid copolymer, ethylene/(meth)acrylic acid ester (random or alternate) copolymer, ethylene/butene copolymer, ethylene/hexene copolymer, polyurethane, polyesters such as polyethylene terephthalate and polyethylene naphthalate, polycarbonate, polyimide, polyetheretherketone, polyimide, polyetherimide, polyamide, entirely aromatic polyamide, polyphenylsulfide, aramide (paper), glass, glass cloth, fluorine-contained resin, polyvinyl chloride, polyvinylidene chloride, cellulose resin, silicone resin, and metal (foil), paper, and polymers made of crosslinked bodies of the above-mentioned resins.

The supporting substrate 1 may be a substrate subjected to no drawing, or may be a substrate subjected to monoaxial or biaxial drawing if necessary. In the case that the supporting substrate 1 is a supporting substrate made of a resin sheet to which thermal contractility is given by drawing treatment or the like, the adhesive area between the pressure-sensitive adhesive layer 2 and the die-bonding adhesive layer 3 is made small by thermal contraction of the supporting substrate 1 after the film 10 is diced. As a result, resultant chips can easily be collected.

In order to improve the close adhesiveness or the holding power of the surface of the supporting substrate 1 to a layer adjacent thereto, or some other property of the surface, the surface may be subjected to any conventional surface treatment. Examples thereof include chemical and physical treatments such as chromic acid treatment, exposure to ozone, exposure to flame, exposure to high-voltage electric shock, and ionized radial ray treatment; and coating treatment with an undercoating agent (such as an adhesive material which will be described later).

The supporting substrate 1 may be made of materials of the same kind or different kinds. If necessary, the supporting substrate 1 may be composed of blended materials of several kinds. In order to give antistatic ability to the supporting substrate 1, a vapor-deposited layer made of an electroconductive material, such as a metal, an alloy or an oxide thereof, and having a thickness of about 30 to 500 Å may be formed on the supporting substrate 1. The supporting substrate 1 may be a monolayer film or a laminated film wherein two or more layers each made of the above-mentioned resin film or some other film are laminated. In the case that the pressure-sensitive adhesive is layer 2 is of a radial ray curable type, a material through which at least a part of radial ray selected from an X-ray, ultraviolet ray, electron beam and others can be transmitted is used.

The thickness of the supporting substrate 1 is, for example, from about 5 to 200 μm, and is not particularly limited, as long as the thickness is such a thickness that the supporting substrate 1 can resist against tensile force based on the die-bonding adhesive layer 3 through the above-mentioned thermal contraction.

The pressure-sensitive adhesive layer 2 is formed on the supporting substrate 1. The adhesive agent used to form the pressure-sensitive adhesive layer 2 is not limited to any especial kind. For example, the following can be used: an ordinary pressure-sensitive adhesive such as a rubber type, acrylic type, silicone type or polyvinyl ether type adhesive; or a radial ray curable adhesive.

The pressure-sensitive adhesive is preferably an acrylic type adhesive comprising an acrylic polymer as a base polymer from the viewpoint of the washability or cleanability of an electronic member which should keep away from contamination, such as a semiconductor wafer or glass, with extra pure water or an organic solvent such as alcohol.

Examples of the acrylic polymer include acrylic polymers each comprising, as one or more monomer components, one or more selected from alkyl esters of (meth)acrylic acid (for example, linear and branched alkyl esters thereof each having an alkyl group having 1 to 30 carbon atoms, in particular, 4 to 18 carbon atoms, such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethylhexyl ester, isooctyl ester, nonyl ester, decyl ester, isodecyl ester, undecyl ester, dodecyl ester, tridecyl ester, tetradecyl ester, hexadecyl ester, octadecyl ester, and eicosyl ester thereof) and cycloalkyl esters of (meth)acrylic acid (for example, cyclopentyl ester and cyclohexyl ester thereof). The wording "esters of (meth)acrylic acid" means esters of acrylic acid and/or methacrylic acid. All of the words including "(meth)" in connection with the present invention have an equivalent meaning.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl(meth)acrylate, carboxypentyl(meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl(meth)acrylate, 2-hydroxypropyl(meth)acrylate, 4-hydroxybutyl (meth)acrylate, 6-hydroxyhexyl (meth)acrylate, 8-hydroxyoctyl(meth)acrylate, 10-hydroxydecyl(meth)acrylate, 12-hydroxylauryl(meth)acrylate, and (4-hydroxylmethylcyclohexyl)methyl(meth)acrylate; sulfonic acid group containing monomers such as styrenesulfonic acid, allylsulfonic acid, 2-(meth)acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer (s) to be used is preferably 40% or less by weight of all the monomer components.

The acrylic polymer may optionally contain, as a copolymerizable monomer component, a polyfunctional monomer in order to crosslink the polymer. Examples of the polyfunctional monomer include hexanediol di(meth)acrylate, (poly) ethylene glycol di(meth)acrylate, (poly)propylene glycol di(meth)acrylate, neopentyl glycol di(meth)acrylate, pentaerythritol di(meth)acrylate, trimethylolpropane tri(meth) acrylate, pentaerythritol tri(meth)acrylate, dipentaerythritol hexa(meth)acrylate, epoxy (meth)acrylate, polyester (meth) acrylate, and urethane (meth)acrylate. These polyfunctional monomers may be used alone or in combination of two or more thereof. The amount of the polyfunctional monomer(s) to be used is preferably 30% or less by weight of all the monomers from the viewpoint of the viscosity of the adhesive layer.

The acrylic polymer can be obtained by polymerizing a single monomer selected from monomers as described above, or a mixture of two or more monomers selected therefrom. The polymerization may be performed by any method selected from solution polymerization, emulsion polymerization, bulk polymerization, suspension polymerization and other polymerization methods. The acrylic polymer is preferably an acrylic polymer containing a low molecular weight substance in only a small amount in order to prevent contamination of a clean object wherein a semiconductor element or the like is to be stuck/fixed. From this viewpoint, the number-average molecular weight of the acrylic polymer is preferably about 300,000 or more, more preferably from about 400,000 to 3,000,000.

For the above-mentioned adhesive, an external crosslinking agent may be appropriately used in order to heighten the number-average molecular weight of the acrylic polymer or the like as the base polymer. A specific example of the method of using the external crosslinking agent may be a method of adding, to the base polymer, the so-called crosslinking agent, such as a polyisocyanate compound, epoxy compound, aziridine compound or melamine type crosslinking agent, so as to cause crosslinking reaction. In the case that the external crosslinking agent is used, the amount thereof is appropriately decided in accordance with the balance with the amount of the base polymer to be crosslinked and further the use purpose of the adhesive. In general, the amount is preferably about 5 parts or less by weight, more preferably from 0.1 to 5 parts by weight for 100 parts by weight of the base polymer. The adhesive may optionally contain various additives known in the prior art, such as a tackifier and an age resistor, in addition to the above-mentioned components.

As the above-mentioned radial ray curable adhesive, an adhesive having a radial ray curable functional group, such as a carbon-carbon double bond, and exhibiting adhesiveness can be used without any limitation. Specific examples thereof include additive type radial ray curable adhesives each obtained by blending a radial ray curable monomer component or oligomer component with any one of other ordinary pressure-sensitive adhesives such as the above-mentioned acrylic adhesives and rubber type adhesives.

Examples of the radial ray curable monomer component to be blended include urethane oligomer, urethane (meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritolmonohydroxy penta(meth)acrylate, dipentaerythritol hexa(meth)acrylate, and 1,4-butanediol di(meth) acrylate. Examples of the radial ray curable oligomer component include urethane type, polyether type, polyester type, polycarbonate type, and polybutadiene type oligomers. The molecular weight thereof is preferably from about 100 to 30,000. In accordance with the kind of the adhesive layer, the amount of the radial ray curable monomer component or oligomer component to be blended can be appropriately decided into such an amount that the adhesive force of the adhesive layer can be lowered. In general, the amount is, for example, from about 5 to 500 parts by weight, preferably from about 40 to 150 parts by weight for 100 parts by weight of the base polymer which constitutes the adhesive layer, for example, the acrylic polymer.

The radial ray curable adhesive may be the above-mentioned additive type radial ray curable adhesive, or an intrinsic type radial ray curable adhesive comprising, as a base polymer, a polymer having a carbon-carbon double bond in a side chain thereof, the main chain thereof, or a main chain terminal thereof. The intrinsic type radial ray curable adhesive is preferable for the following reason: the adhesive does not need to contain any oligomer component or the like, which is a low molecular weight component, or does not contain a large amount thereof; therefore, no oligomer component or the like moves into the adhesive layer with the passage of time so that the layer structure of the adhesive layer can be kept stable.

The above-mentioned base polymer, which has a carbon-carbon double bond, may be any polymer that has a carbon-carbon double bond and further has viscosity. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant to condensation-react or addition-react with a compound having a functional group reactive with the above-mentioned functional group and a carbon-carbon double bond while keeping the radial ray curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-$\alpha,\alpha$-dimethylbenzyl isocyanate. The used acrylic polymer may be an acrylic polymer copolymerized with any one of the hydroxyl-containing monomers exemplified above, or an ether compound such as 2-hydroxyethyl vinyl ether, 4-hydroxybutyl vinyl ether or diethylene glycol monovinyl ether.

The intrinsic type radial ray curable adhesive may be made only of the above-mentioned base polymer (in particular, the acrylic polymer), which has a carbon-carbon double bond. However, the above-mentioned radial ray curable monomer component or oligomer component may be incorporated into the base polymer to such an extent that properties of the adhesive are not deteriorated. The amount of the radial ray curable oligomer component or the like is usually 30 parts or less by weight, preferably from 0 to 10 parts by weight for 100 parts by weight of the base polymer.

In the case that the radial ray curable adhesive is cured with ultraviolet rays or the like, a photopolymerization initiator is incorporated into the adhesive. Examples of the photopolymerization initiator include $\alpha$-ketol compounds such as 4-(2-hydroxyethoxy)phenyl(2-hydroxy-2-propyl)ketone, $\alpha$-hydroxy-$\alpha,\alpha'$-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl) oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates.

The amount of the photopolymerization initiator to be blended is, for example, from about 0.05 to 20 parts by weight for 100 parts by weight of the acrylic polymer or the like which constitutes the adhesive as a base polymer.

The radial ray curable adhesive is disclosed in, e.g., JP-A-60-196956. Examples thereof include rubber type adhesives and acrylic adhesives each which comprises an addition-polymerizable compound having two or more unsaturated bonds or a photopolymerizable compound such as alkoxysilane having an epoxy group, and a photopolymerization initiator such as a carbonyl compound, an organic sulfur compound, a peroxide, an amine or an onium salt compound.

The thickness of the pressure-sensitive adhesive layer 2 is not particularly limited. From the viewpoint of the compatibility between the preventing of cross is sections of the chips from being cracked or chipped and the fixation and hold of the adhesive layer, and other viewpoints, the thickness is preferably from about 1 to 50 µm, preferably from 2 to 30 µm, more preferably from 5 to 25 µm.

The die-bonding adhesive layer 3 is formed on the pressure-sensitive adhesive layer 2 and in an area onto which a circular semiconductor wafer 4 is to be stuck. The die-bonding adhesive layer 3 is a layer for sticking and fixing the semiconductor wafer 4 to prevent the semiconductor wafer 4 (cut pieces) from being scattered when the wafer 4 is diced into the form of chips. The die-bonding adhesive layer 3 has a function that when the semiconductor wafer 4 pressed and stuck onto the layer 3 is diced into the form of chips, the chips (cut pieces) are closely adhered to the die-bonding adhesive layer 3 so as to be prevented from being scattered. The layer 3 also has a function as an adhesive layer for fixing, when any one of the chips is mounted, the chip onto a semiconductor element (such as a substrate or a chip). It is particularly important for the die-bonding adhesive layer 3 to have such adhesive property that when the work is diced, the cut pieces are not scattered. In the dicing die-bonding film 10, the die-bonding adhesive layer 3 is arranged as a previously-formed portion to which the semiconductor wafer 4 is to be attached.

The die-bonding adhesive layer 3 can be formed from an ordinary die-bonding adhesive. The die-bonding adhesive is preferably a die-bonding adhesive which can be made into a sheet form. A specific example of the die-bonding adhesive is preferably a die-bonding adhesive made of a thermoplastic resin or a thermosetting resin. The die-bonding adhesive may be made of one or more selected from die-bonding adhesives. The die-bonding adhesive layer 3 is preferably a layer which can be stuck onto the semiconductor wafer 4 at 70° C. or lower, more preferably a layer which can be done at room temperature.

Examples of the thermoplastic resin used as the die-bonding adhesive (thermoplastic die-bonding adhesive) include saturated polyester resin, thermoplastic polyurethane resin, amide type resin (nylon type resin), and imide type resin. Examples of the thermosetting resin (thermosetting die-bonding adhesive) include epoxy resin, unsaturated polyester resin, thermosetting acrylic resin, and phenol resin. The thermosetting resin is preferably a thermosetting resin which is subjected to solvent-removing treatment so as to be turned into a sheet or turned into a B-stage (temporarily cured). A mixture of any one of these thermosetting resins and any one of these thermoplastic resins can also be used in a temporarily-cured state. In the present invention, a silicone type, rubber type, urethane type, imide type, or acrylic type resin, or some other type resin having a high glass transition temperature can also be used as the die-bonding adhesive.

The die-bonding adhesive layer 3 may have a multi-layered structure having two or more layers made of an appropriate combination selected from thermoplastic resins having different glass transition temperatures and thermosetting resins having different thermosetting temperatures. Since cutting water is used in the step of dicing the semiconductor wafer 4, the die-bonding adhesive layer 3 may absorb humidity to have a larger water content than the layer 3 in an ordinary state. If the layer 3 having such a high water content is stuck, as it is, onto a substrate or the like, water vapor remains in the adhesive interface at the stage of after-curing so that the layer 3 may float. Accordingly, the die-bonding adhesive layer 3 is made into a structure wherein a film having a high moisture permeability is sandwiched between die-bonding adhesives, whereby water vapor can be diffused through the film at the after-curing stage to avoid the above-mentioned problem. Therefore, the die-bonding adhesive layer 3 may have a multi-layered structure wherein an adhesive layer, a film and another adhesive layer are laminated in this order.

The thickness of the die-bonding adhesive layer 3 is not particularly limited. For example, the thickness is preferably from about 5 to 100 μm, more preferably from about 10 to 50 μm.

The die-bonding adhesive layer 3 may be protected by a separator (not illustrated). That is, a separator may be fitted thereto at necessary. The separator has a function as a protecting member for protecting the die-bonding adhesive layer 3 until the dicing die-bonding film is practically used. The separator can be used as a supporting substrate when the die-bonding adhesive layer 3 is transferred onto the pressure-sensitive adhesive layer 2. The separator is peeled when a work is attached and stuck onto the die-bonding adhesive layer 3. The separator may be a plastic film or a paper sheet having a surface coated with a releasing agent such as polyethylene, polypropylene, a fluorine-containing releasing agent, or a long-chain alkyl acrylate releasing agent.

The marks 5 are position-recognizing points for deciding, when the semiconductor wafer 4 is attached and stuck onto the dicing die-bonding film 10, the position to which the wafer 4 is to be attached and stuck. In the present embodiment, the marks 5 are each made of a colored layer. The marks 5 are arranged on portions of the supporting substrate 1 from which the pressure-sensitive adhesive layer 2 and the die-bonding adhesive layer 3 are removed. This makes it possible that when the semiconductor wafer 4 is attached and stuck onto the dicing die-bonding film 10, the generation of a positional slippage thereof is prevented to improve the yield. In the present embodiment, the marks 5 are composed of marks 5a (for example, a size of 5 mm×10 mm) and a mark 5b (for example, a size of 5 mm×20 mm). The marks 5a are arranged on line A-A passing through the central point of the die-bonding adhesive layer 3 (diameter: 210 mm) having a circular planar shape. In FIG. 1(a), the mark 5b is arranged below the die-bonding adhesive layer 3. The shortest distances between the marks 5a and the die-bonding adhesive layer 3 and between the mark 5b and the layer 3 are 35 mm and 10 mm, respectively. The marks 5 are preferably arranged at positions of the dicing die-bonding film 10 which are not to be attached to a mount frame (not illustrated) for the following reason: mount frames are generally transparent; therefore, if the marks 5 are arranged at the position to which a mount frame is to be attached, the position is not easily detected. It is also preferable that the marks are arranged at positions of the dicing die-bonding film 10 remaining even after the mount frame, which is used in a mounting step, is formed. The planar shapes of the marks 5 are not particularly limited, and the sizes thereof are not particularly limited, as long as the marks make it possible that the positions thereof are recognized. The marks may be appropriately modified within the scope not departing from the claims.

The colored layer as each of the marks 5 is made of an ink, paint or the like comprising a colorant. The kind of the color of the colorant is preferably a color having a wavelength range which can be recognized by a position-recognizing sensor of color-recognizing type. Specifically, the color is preferably a reddish color such as red, vermilion, cinnabar red or orange from the viewpoint of the easiness of the recognition of the color. However, yellow or violet may be used. Examples of the above-mentioned colorant include azo pigment, vermilion, Bengal (red iron oxide), alizarin, crimson, cochineal, and quinacridon pigments. The thickness of the colored layer is not particularly limited, and is preferably from 0.5 to 10 μm.

The positions of the marks 5 are recognized by detecting marks 5 in a conventionally known manner. Specific examples thereof include a manner of recognizing and detecting the marks 5 by various sensors such as transmission type, reflection type, color-distinguishing type, and thickness-detecting type sensors; and a manner of using an image-recognizing means such as a CCD camera. In such a manner, the marks 5 are recognized, and then the resultant position data are compared with previously-decided standard coordinates. As a result, when a positional slippage is detected, the position of the dicing die-bonding film 10 is controlled to correct the positional slippage. The position control is minutely performed through an appropriate means capable of shifting the dicing die-bonding film 10 forward and backward freely.

The mount frame is made of, for example, a metal- or plastic-molded body. An opening made in the mount frame has a larger size than the semiconductor wafer 4 to be diced, and the shape thereof is not particularly limited.

The following describes a process for producing the dicing die-bonding film according to the present embodiment.

First, a composition for a die-bonding adhesive is prepared, and then a mixed solution thereof is produced. This mixed solution is applied onto a separator made of, for example, a polyester film or the like. Next, the separator onto which the mixed solution is applied is dried at a given temperature to form the die-bonding adhesive layer 3 on the separator.

Separately, an adhesive solution is directly applied onto the supporting substrate 1, and then dried to form the pressure-sensitive adhesive layer 2. Next, the die-bonding adhesive layer 3 is transferred onto the pressure-sensitive adhesive layer 2 to form the die-bonding adhesive layer 3 only in an area onto which the semiconductor wafer 4 is to be attached and stuck.

The method for forming the marks 5 as the colored layers are not particularly limited, and may be a method known in the prior art, for example, a method of printing the marks 5 on the supporting substrate 1. As described above, the dicing die-bonding film 10 according to the present embodiment can be produced. The marks 5 are not formed on the pressure-sensitive adhesive layer 2. However, the marks 5 may be formed on the surface opposite to the surface on which the die-bonding adhesive layer 3 is formed.

The following describes a method for fixing a chip-form work by use of the dicing die-bonding film 10 according to the present embodiment.

The separator, which may be optionally formed on the die-bonding adhesive layer 3, is peeled if it is present, and subsequently the dicing die-bonding film 10 of the present invention is used as follows. The semiconductor wafer 4 as a work is pressed and stuck onto the die-bonding adhesive layer 3 of the dicing die-bonding film 10 so as to bond, hold and fix the semiconductor wafer 4 onto die-bonding adhesive layer 3. The pressing and sticking are performed in an ordinary manner. Next, the semiconductor wafer 4 is diced into the form of chips with an appropriate means such as a rotary round blade. In this way, the semiconductor wafer 4 including the die-bonding adhesive layer 3 is made into semiconductor chips (chip-form works).

Next, one of the semiconductor chips, together with the die-bonding adhesive layer 3, is peeled from the pressure-sensitive adhesive layer 2. The picked-up semiconductor chip is bonded and fixed through the die-bonding adhesive layer 3 onto a semiconductor element as an object on which the chip is to be stuck/fixed. Examples of the semiconductor element include a lead frame, a TAB film, a substrate, or a separately-produced chip-form work. The object may be a deformable object, which is easily deformed, or a non-deformable object (such as a semiconductor wafer), which is not easily deformed. The object is preferably a semiconductor wafer. In the case that the die-bonding adhesive layer 3 is of a thermo-setting type, the work is bonded and fixed onto the object by heating and curing, so as to improve the heat resistance. The chip-form work bonded and fixed through the die-bonding adhesive layer 3 onto the supporting substrate or the like can be subjected to a reflow step.

Figure 2:
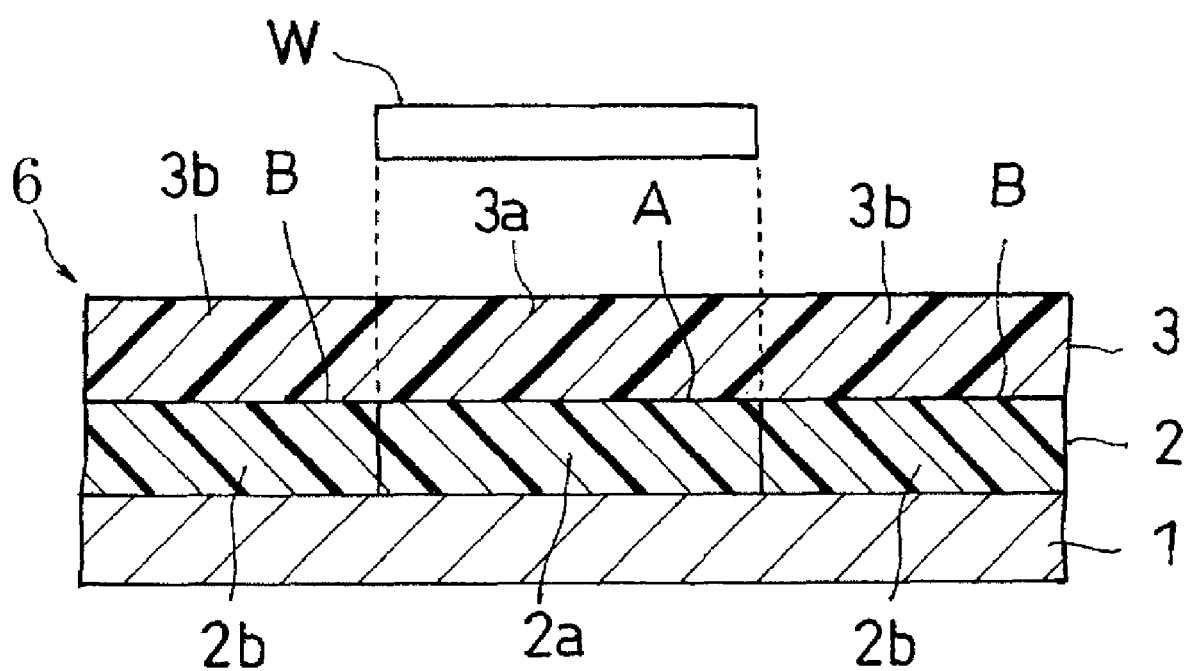
FIG. 2 is a sectional view which schematically illustrates another dicing die-bonding film according to Embodiment 1 of the present invention.

In the present embodiment, the pressure-sensitive adhesive layer 2 can be designed to have portions 2a and 2b in such a manner that the peelability of the pressure-sensitive adhesive layer 2 from the die-bonding adhesive layer 3 satisfies the following relationship: the peelability of an interface (A) corresponding to a work-attaching area 3a is larger than the peelability of an interface (B) corresponding to other area 3b than the area 3a (see FIG. 2). The pressure-sensitive adhesive layer portion 2a corresponds to the work-attaching area 3a of the die-bonding adhesive layer 3, and the pressure-sensitive adhesive layer portion 2b corresponds to the area 3b other than the area 3a.

Figure 3:
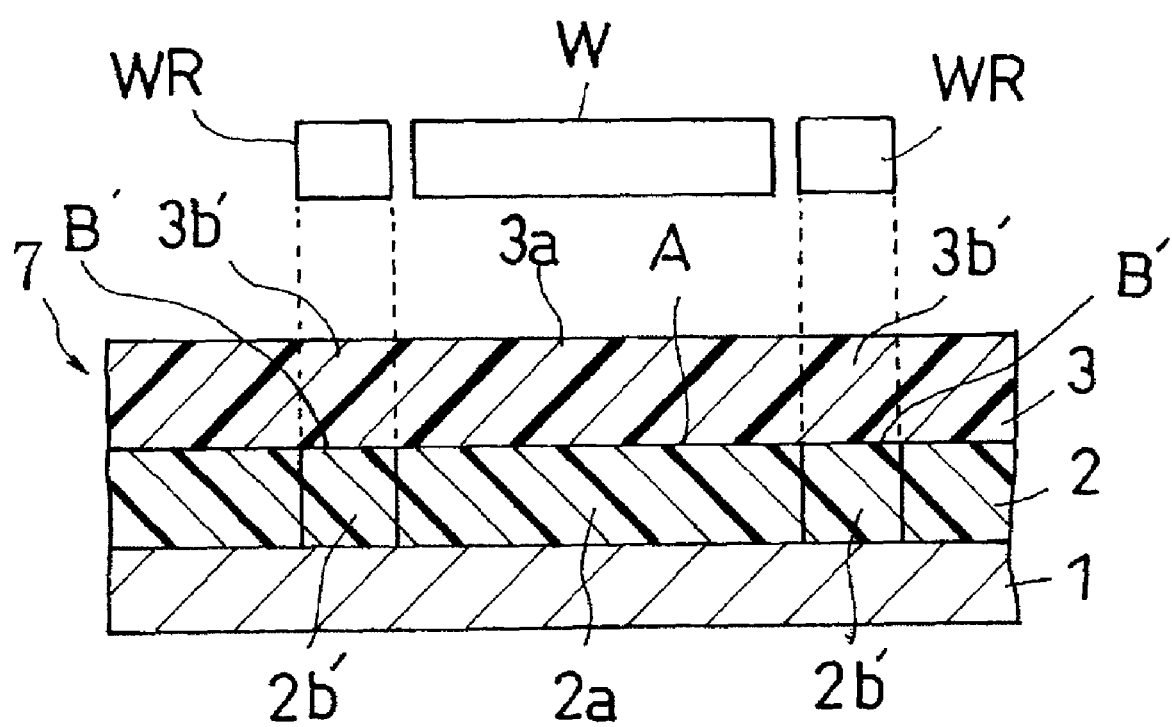
FIG. 3 is a sectional view which schematically illustrates a further dicing die-bonding film according to Embodiment 1 of the present invention.
Figure 4:
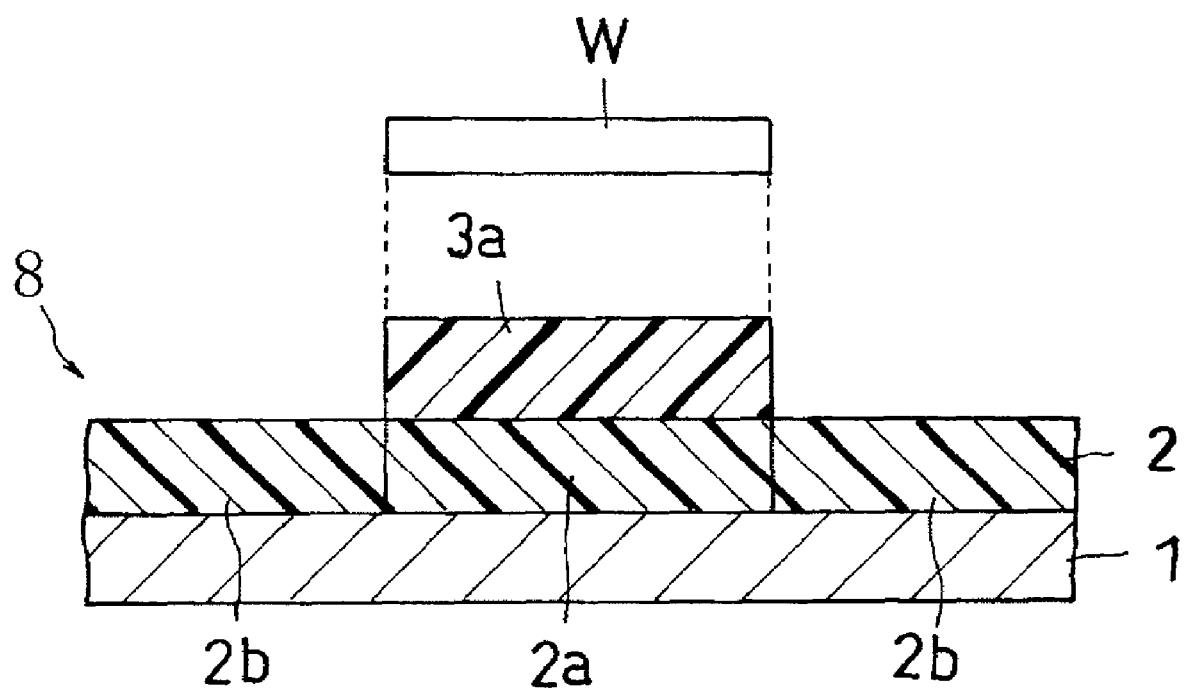
FIG. 4 is a sectional view which schematically illustrates an even further dicing die-bonding film according to Embodiment 1 of the present invention.

The pressure-sensitive adhesive layer 2 may be designed in such a manner that the peelability of an interface (B') between a mount-frame-attaching area 3b' and an pressure-sensitive adhesive layer portion 2b' formed correspondingly to this area 3b' satisfies the following relationship: the peelability of the interface (A) is larger than the peelability of the interface (B') (see FIG. 3). In the pressure-sensitive adhesive layer 2 illustrated in FIG. 2, the entire portion other than the pressure-sensitive adhesive layer portion 2a constitutes the pressure-sensitive adhesive layer portion 2b. However, in the case illustrated in FIG. 3, a part of area other than the pressure-sensitive adhesive layer portion 2a may be made to the pressure-sensitive adhesive layer portion 2b. The pressure-sensitive adhesive layer 2 may be designed to have 2a and 2b in such a manner that the adhesive force of a portion 2a corresponding to the work-attaching area 3a and that of other portion 2b than the portion 2a satisfy the following relationship: the adhesive force of the pressure-sensitive adhesive layer portion 2a is smaller than that of the pressure-sensitive adhesive layer portion 2b. The adhesive used to form the pressure-sensitive adhesive layer 2 illustrated in FIGS. 2 to 4 is not limited to any especial kind. The adhesive is preferably a radial ray curable adhesive capable of making a difference between the adhesive force of the pressure-sensitive adhesive layer portion 2a and that of the pressure-sensitive adhesive layer portion 2b easily. About the radial ray curable adhesive, the adhesive force thereof can easily be lowered by an increase in the crosslinking degree thereof by irradiation with radial rays such as ultraviolet rays. Accordingly, the adhesive force of the pressure-sensitive adhesive layer portion 2a can easily be made remarkably lower by curing the radial ray curable adhesive layer in accordance with the work-attaching area 3a. Since the adhesive layer 3 or 3a is attached to the cured pressure-sensitive adhesive layer portion 2a, the adhesive force of which is lowered, the interface between the pressure-sensitive adhesive layer portion 2a and the adhesive layer area 3a has a property that the portion 2a and the area 3a are easily peeled therein from each other when the semiconductor chip is picked up. On the other hand, the portion which is irradiated with no radial ray has a sufficient adhesive force, so as to constitute the pressure-sensitive adhesive layer portion 2b.

In each of the dicing die-bonding films 6 and 7 illustrated FIGS. 2 and 3, the pressure-sensitive adhesive layer portion 2b made of the non-cured radial ray curable adhesive is stuck onto the adhesive layer 3 so that the holding power necessary when the semiconductor wafer is diced can be kept. In such a way, radial ray curable adhesive can support the die-bonding adhesive layer 3 for sticking/fixing a chip-form work (a semi-conductor chip or the like) onto a substrate, chip-form work, or some other object (referred to as an semiconductor element) with good balance between bonding and peeling. In a dicing die-bonding film 8 illustrated in FIG. 4, a pressure-sensitive adhesive layer portion 2b makes it possible to fix a wafer ring and others. The pressure-sensitive adhesive layer 2 is formed to make the adhesive force of the pressure-sensitive adhesive layer portion 2a smaller than that of the pressure-sensitive adhesive layer portion 2b. In each of the dicing die-bonding films 6 and 7 illustrated FIGS. 2 and 3, the peelability of the interface (A) is made larger than that of the interface (B) regarding the adhesive force to the adhesive layer 3. In the dicing die-bonding film 8 as illustrated in FIG. 4, the adhesive force of the pressure-sensitive adhesive layer portion 2a is made smaller than that of the pressure-sensitive adhesive layer portion 2b in connection with, for example, a SUS 304 plate (#2000 polished) as an object to which a chip is to be stuck/fixed.

In the case that the pressure-sensitive adhesive layer 2 is made of a radial ray curable adhesive, the radial ray curable pressure-sensitive adhesive layer 2 is formed on the supporting substrate 1 and then the portion thereof corresponding to the work-attaching area 3a is partially irradiated with radial rays so as to be cured, thereby forming the pressure-sensitive adhesive layer portion 2a. The partial irradiation with the radial rays can be performed through a photo-mask wherein a pattern corresponding to the area 3b other than the work-attaching area 3a, and other areas is formed. The partial irradiation may be performed by radiating ultraviolet rays spotwise onto the adhesive layer and curing the layer. The formation of the radial ray curable pressure-sensitive adhesive layer 2 can be performed by transferring the layer formed on the separator onto the supporting substrate 1. The partial irradiation with the radial rays may be applied to the radial ray curable pressure-sensitive adhesive layer 2 formed on the separator.

In the case that the pressure-sensitive adhesive layer 2 is made of a radial ray curable adhesive, it is possible to use the supporting substrate 1 having at least one surface wherein a part or the whole of other portion than the portion corresponding to the work-attaching area 3a is shielded from light, form the radial ray curable pressure-sensitive adhesive layer 2 on this substrate, and radiate radial rays thereon so as to cure the portion corresponding to the work-attaching area 3a, thereby making the adhesive force of the pressure-sensitive adhesive layer portion 2a low. The member for the light-shielding may be made by printing or vapor-depositing a material which can be made into a photo-mask onto a supporting film. According to this production process, the dicing die-bonding film of the present invention can be produced effectively.

In the case that the curing based on the radial ray radiation is hindered by oxygen, it is desired to block oxygen (air) from the surface of the radial ray curable pressure-sensitive adhesive layer 2 in any manner. Examples thereof include a manner of coating the surface of the pressure-sensitive adhesive layer 2 with a separator; and a manner of radiating radial rays such as ultraviolet rays in the atmosphere of nitrogen.

About the adhesive force of the pressure-sensitive adhesive layer 2 to the die-bonding adhesive layer 3 in each of the dicing die-bonding films 6 and 7 as illustrated in FIGS. 2 and 3, the adhesive force of the pressure-sensitive adhesive layer portion 2a is designed to be smaller than that of the pressure-sensitive adhesive layer portion 2b. The adhesive force (90° peeling value at a peeling speed of 300 mm/minute) of the pressure-sensitive adhesive layer portion 2a at room temperature (23° C.) is preferably 0.5 N/20 mm or less, more preferably from 0.01 to 0.42 N/20 mm, even more preferably from 0.01 to 0.35 N/20 mm from the viewpoints of the fixing and holding power of the wafer, the collecting power of chips produced, and others. The adhesive force of the pressure-sensitive adhesive layer portion 2b is preferably from about 0.5 to 20 N/20 mm. Even if the pressure-sensitive adhesive layer portion 2a has a low peeling adhesive force, the generation of chip-scattering or the like can be suppressed by the adhesive force of the pressure-sensitive adhesive layer portion 2b so that a sufficient holding force for wafer-processing can be exhibited.

In the dicing die-bonding film 8 illustrated in FIG. 4, the portion 2a corresponding to the work-attaching area 3a and the portion 2b other than the portion 2a of the pressure-sensitive adhesive layer 2 are designed in such a manner that the adhesive force of the pressure-sensitive adhesive layer portion 2a is smaller than that of the pressure-sensitive adhesive layer portion 2b. The adhesive force (under the same conditions as described above) of the pressure-sensitive adhesive layer portion 2a to the work-attaching area 3a is the same as described above, and is preferably 0.5 N/20 mm or less, more preferably from 0.01 to 0.42 N/20 mm, even more preferably from 0.01 to 0.35 N/20 mm.

Each of the dicing die-bonding films 6 to 8 as illustrated in FIGS. 2 to 4 is preferably designed in such a manner that the adhesive force of the work-attaching area 3a to the work is larger than that of the area 3a to the pressure-sensitive adhesive layer portion 2a. The adhesive force to the work is appropriately adjusted dependently on the kind of the work.

The adhesive force (under the same conditions as described above) of the work-attaching area 3a to the pressure-sensitive adhesive layer 2a is preferably 0.5 N/20 mm or less, more preferably from 0.01 to 0.42 N/20 mm, even more preferably from 0.01 to 0.35 N/20 mm, as described above. The adhesive force (under the same conditions as described above) of the work-attaching area 3a to the work is preferably from 10 to 50 N/20 mm, more preferably from 10 to 30 N/20 mm from the viewpoints of the reliability of dicing, picking-up, and die-bonding and the pick-up property of the dicing die-bonding film.

In the case that the area 3b other than the work-attaching area 3a is made into the mount-frame-attaching area 3b' in the dicing die-bonding film 6 illustrated in FIG. 2, it is preferable to design the area 3b' in such a manner that the adhesive force of the mount-frame-attaching area 3b' of the die-bonding adhesive layer 3 to the mount frame is smaller than that of the area 3b' to the pressure-sensitive adhesive layer portion 2b'. The adhesive force to the mount frame can be appropriately adjusted dependently on the kind of the mount frame.

The adhesive force (under the same conditions as described above) of the die-bonding adhesive layer 3 to the pressure-sensitive adhesive layer portion 2b' is preferably from about 0.5 to 20 N/20 mm, as described above. The adhesive force (under the same conditions as described above) of the die-bonding adhesive layer 3 to the mount frame is preferably from 0.3 to 5 N/20 mm, more preferably from 0.5 to 5 N/20 mm from the viewpoints of the working-efficiency or yield of dicing and die-bonding.

Antistatic power can be supplied to the dicing die-bonding film in order to prevent the generation of static electricity when the film is bonded or peeled, circuit breakdown through the electrification of a work (for example, a semiconductor wafer) on the basis of the static electricity, and other disadvantages. The supply of the antistatic power can be performed by an appropriate method such as a method of adding an antistatic agent or an electroconductive material to the supporting substrate 1, the pressure-sensitive adhesive layer 2 or the die-bonding adhesive layer 3, or a method of depositing an electroconductive layer made of a charge-transfer complex or a metal film onto the supporting substrate 1. Among such methods, preferable is a method wherein impurity ions, which may deteriorate the semiconductor wafer, are not easily generated. Examples of the electroconductive material (electroconductive filler), which is incorporated to confer electric conductivity or improve the thermal conductivity, include sphere-, needle- or flake-form metal powder made of silver, aluminum, gold, copper, nickel, and electroconductive alloy; amorphous carbon black; and graphite.

Embodiment 2

In Embodiment 1, the case that colored layers made of ink or the like are used as the marks has been described. However, the present invention is not limited to this case.

Figure 5:
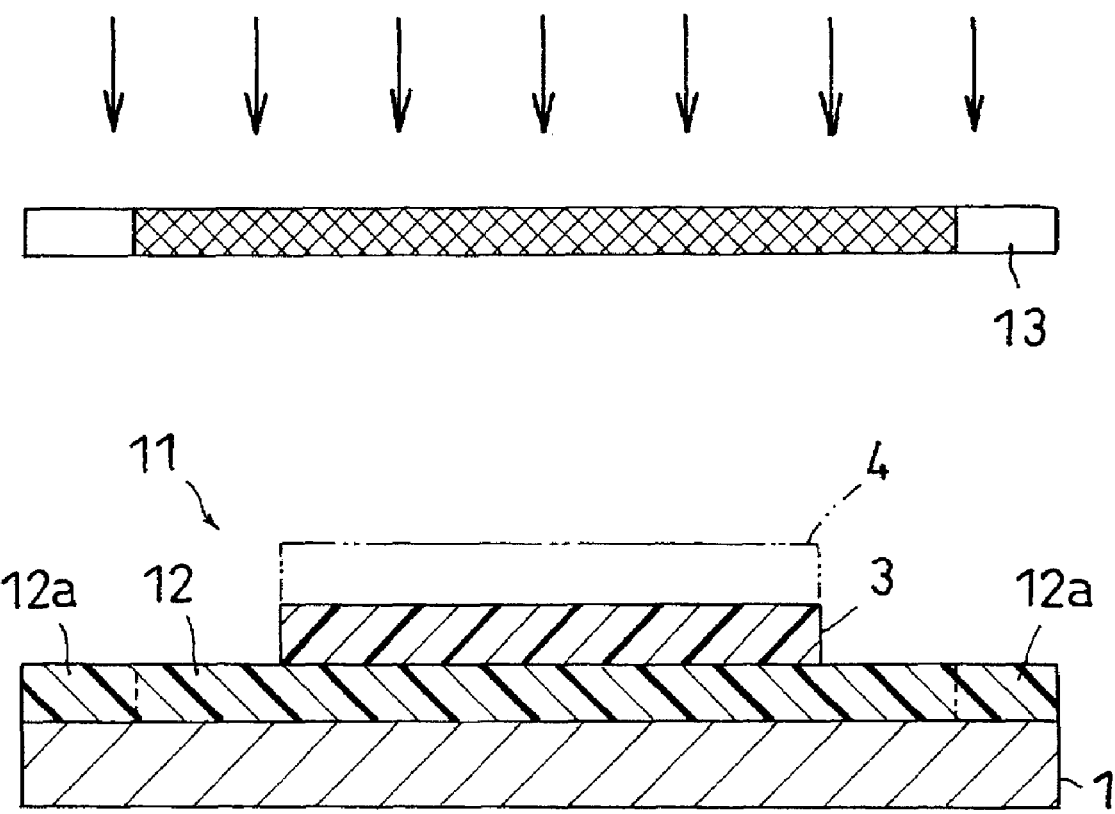
FIG. 5 is a sectional view which schematically illustrates a dicing die-bonding film according to Embodiment 2 of the present invention.

For example, an embodiment wherein only a given area of an adhesive layer is colored and the area is used as a mark can be adopted instead of the embodiment using the colored layer. FIG. 5 is a sectional view which schematically illustrates a dicing die-bonding film 11 according to the present embodiment.

An adhesive layer 12 in the present embodiment is a layer wherein a compound capable of being colored by irradiation with radial rays is incorporated into the adhesive layer 12 in Embodiment 1, and is irradiated through a photo-mask 13 having a given pattern with radial rays, whereby only a given area of the adhesive layer 12 is irradiated. In this way, only the area irradiated is colored to make it possible to form marks 12a, in a self-alignment manner, correspondingly to the pattern of the photo-mask 13. The recognition of the position of the die-bonding adhesive layer 3 is performed by recognizing and detecting the marks 12a with a photosensor or the like.

The compound colored by irradiation with radial rays is a compound which is colorless or has a light color before the irradiation with radical rays but comes to have a color by the irradiation. A specific example thereof is preferably a leuco dye.

Preferable examples of the leuco dye include conventional triphenylmethane type, fluoran type, phenothiazine type, auramine type, and spiropyran type dyes. Specific examples thereof include 3-[N-(p-tolylamino)]-7-anilinofluoran, 3-[N-(p-tolyl)-N-methylamino]-7-anilinofluoran, 3-[N-(p-tolyl)-N-ethylamino]-7-anilinofluoran, 3-diethylamino-6-methyl-7-anilinofluoran, crystal violet lactone, 4,4',4"-trisdimethylaminotriphenylmethanol, and 4,4',4"-trisdimethylaminotriphenylmethane.

A color developer which is preferably used together with any one of these leuco dyes may be a conventionally-used electron acceptor, such as an initial polymer of phenol formalin resin, an aromatic carboxylic acid derivative, or active white clay. In the case that the color tone of the dye is changed, combinations thereof with various known color formers may be used.

Such a compound colored by irradiation with radial rays may be dissolved once into an organic solvent and then incorporated into the adhesive, or may be made into a fine powder form and then incorporated into the adhesive. The ratio of this compound to be used in the adhesive layer 12 is preferably 10% or less by weight, more preferably from 0.01 to 10% by weight, even more preferably from 0.5 to 5% by weight. If the ratio of the compound is more than 10% by weight, radial rays radiated onto the adhesive layer 12 are excessively absorbed by this compound so that the adhesive layer 12 is insufficiently cured to lower the adhesive force thereof insufficiently. In order for the compound to be sufficiently colored, the ratio of the compound is preferably set to 0.01% or more by weight.

Embodiment 3

Figure 6:
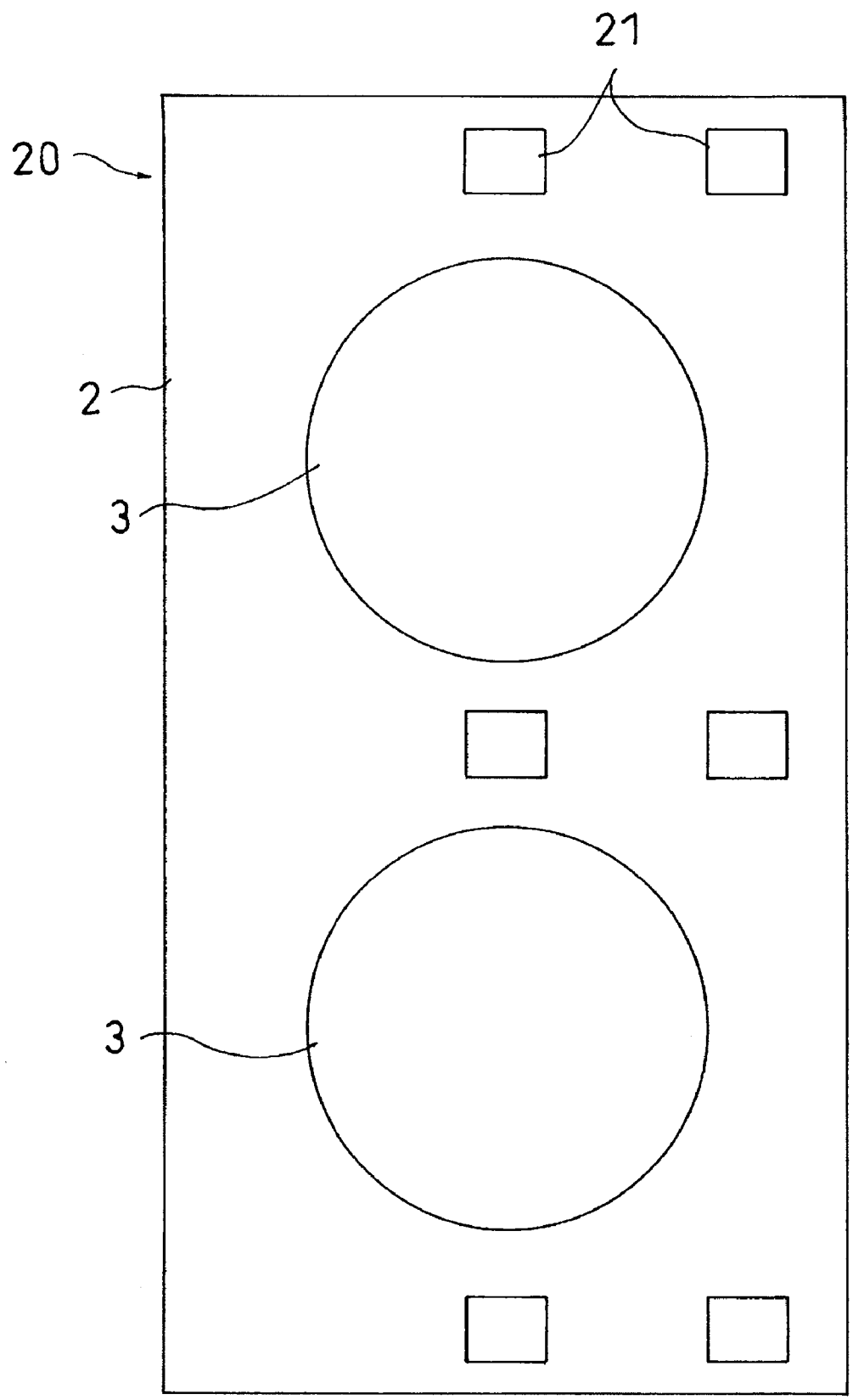
FIG. 6 is a plan view which schematically illustrates a dicing die-bonding film according to Embodiment 3 of the present invention.

The present embodiment is different from Embodiment 1 in that a marking adhesive film is used instead of the colored layer as the marks. The present embodiment is described hereinafter. FIG. 6 is a plane view which schematically illustrates a dicing die-bonding film 20 in the case that a marking adhesive film 21 is used.

The marking adhesive film 21 in the present embodiment 3 is made of an adhesive film. The material of the marking adhesive film 21 may be, for example, a colored polyolefin type adhesive tape. The thickness of the film marking adhesive 21 is not particularly limited, and is preferably from, e.g., 5 to 200 μm.

The position where the marking adhesive film 21 is formed is on any portion of a pressure-sensitive adhesive layer 2 except the portion where a die-bonding adhesive layer 3 is formed, the rear face of a supporting substrate 1, or between the supporting substrate 1 and the pressure-sensitive adhesive layer 2. The planer shape thereof is a rectangle of 5 mm×10 mm size. However, the planer shape of the film 21 is not particularly limited. The size thereof is not particularly limited if the position thereof can be recognized.

The recognition of the position of the marking adhesive film 21 can be performed by a method known in the prior art, which is the same as described in Embodiment 1.

Embodiment 4

Figure 7A:
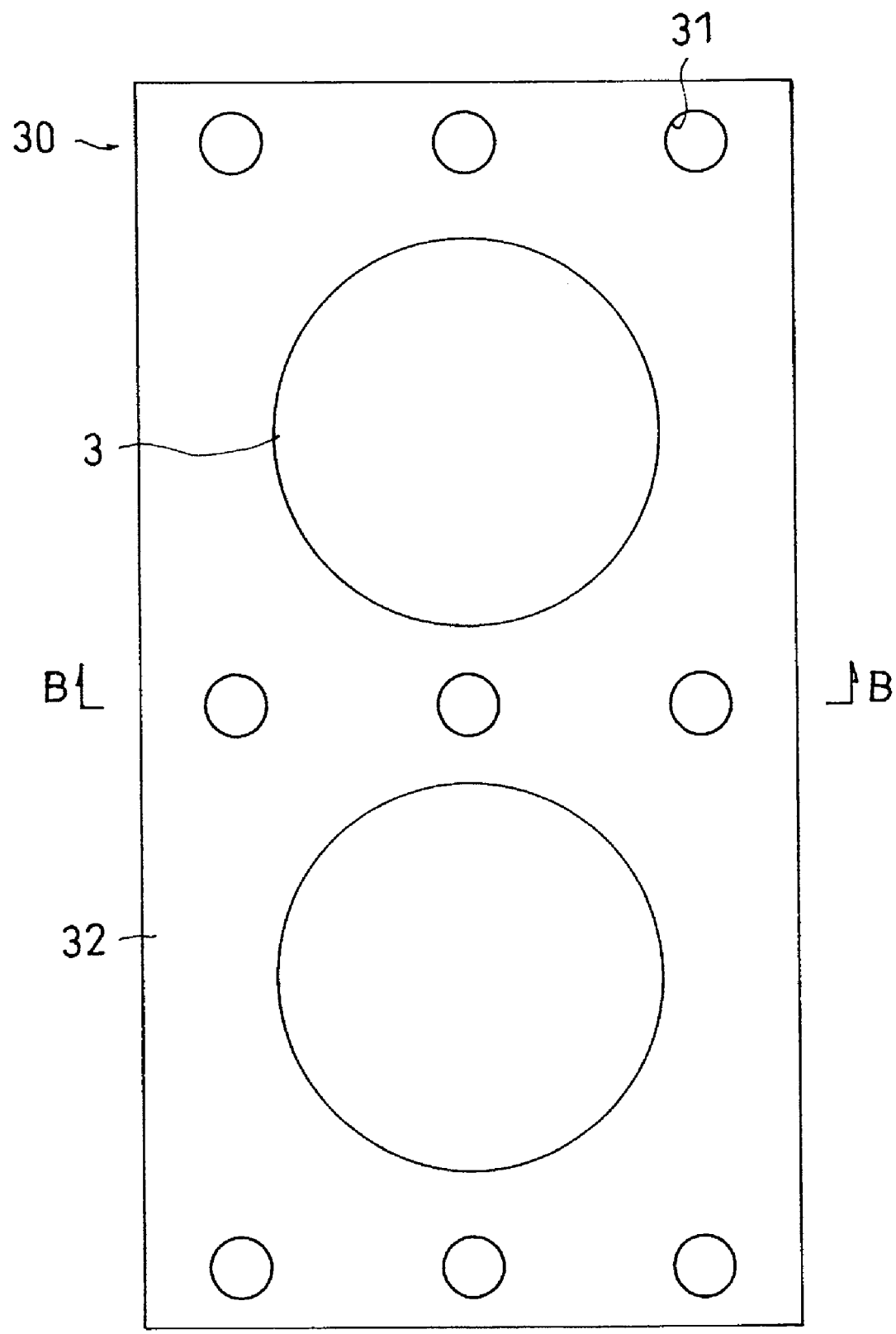
FIGS. 7(a) and 7(b) are views which schematically illustrate a dicing die-bonding film according to Embodiment 4 of the present invention.
Figure 7B:
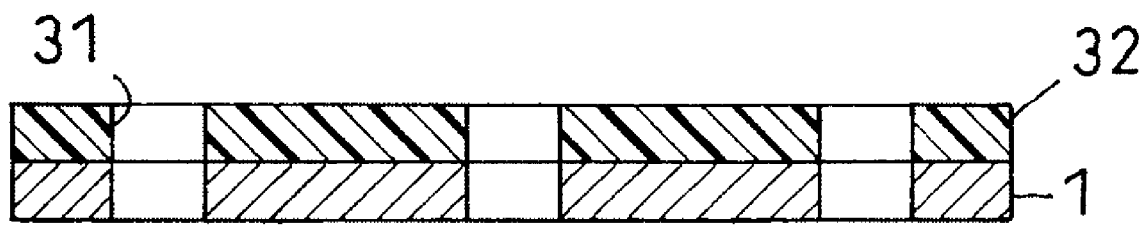

The present embodiment is different from Embodiment 1 in that openings are used instead of the colored layer as the marks. The present embodiment is described hereinafter. FIG. 7 are each a plain view which schematically illustrates a dicing die-bonding film 30 wherein openings 31 made by punching are used. FIG. 7(a) is a plan view which schematically illustrates the dicing die-bonding film 30, and FIG. 7(b) is a sectional view of the film taken on line B-B of FIG. 7(a), which is viewed along arrows.

The dicing die-bonding film 30 according to the present embodiment 4 has plural openings 31 at given positions. The openings 31 are made by punching or the like, and penetrate through an adhesive layer 32 to reach a supporting substrate 1, as illustrated in FIG. 7(b). The planar shape of the openings 31 is, for example, a circular shape having a diameter of 5 mm, but is not particularly limited. The size thereof is not particularly limited if the position thereof can be recognized. The method for making the openings 31 may be a method of using a punch or the like.

The recognition of the position of the marking adhesive film 21 can be performed by a method known in the prior art, which is the same as described in Embodiment 1.

Embodiment 5

Figure 8:
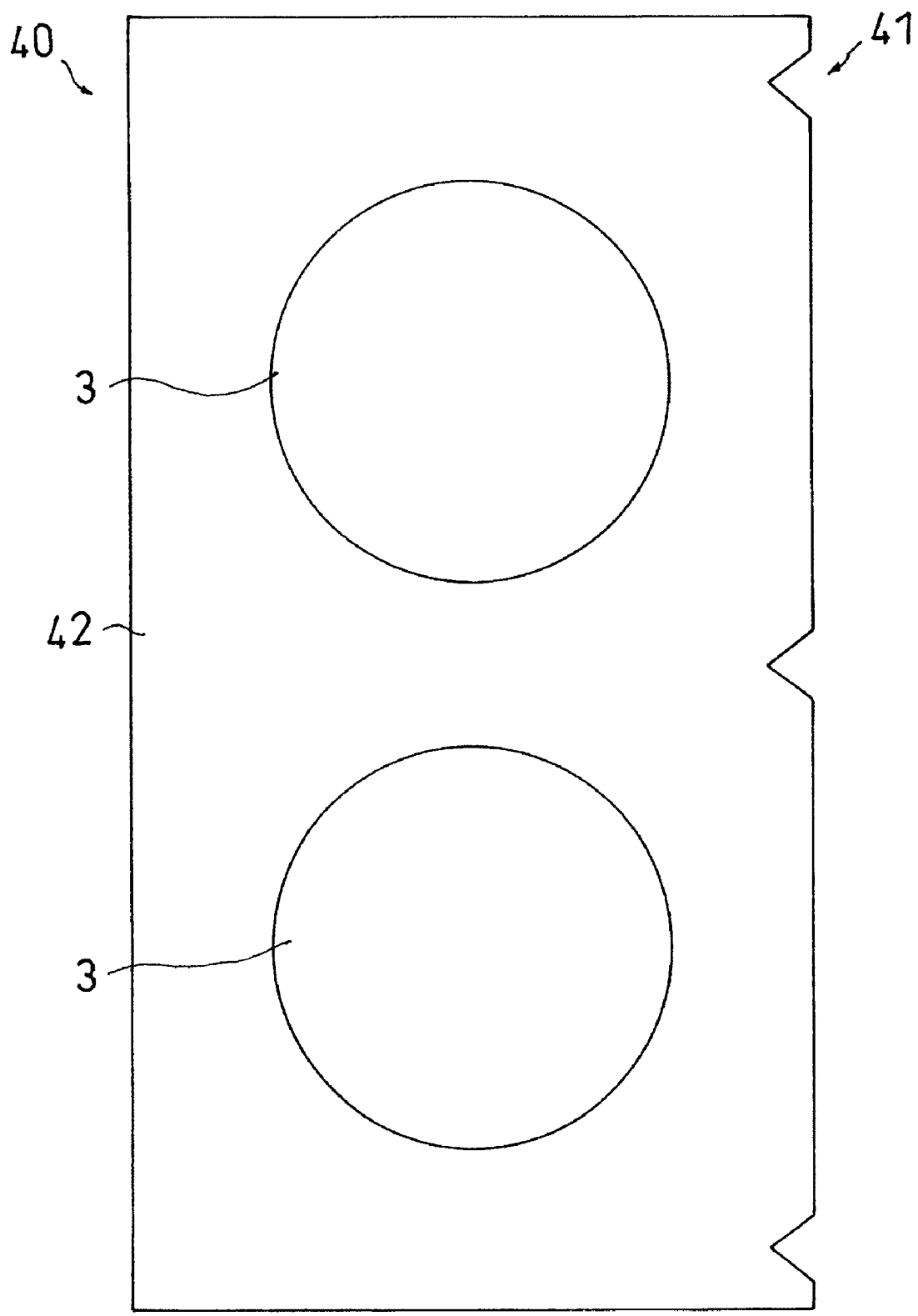
FIG. 8 is a plan view which schematically illustrates a dicing die-bonding film according to Embodiment 5 of the present invention.

The present embodiment is different from Embodiment 1 in that notches are used instead of the colored layer as the marks. The present embodiment is described hereinafter. FIG. 8 is a plan view which schematically illustrates a dicing die-bonding film 40 wherein notches 41 made by punching are used.

In the dicing die-bonding film 40 according to the present embodiment 5, the plural notches 41 are made at given positions in one side thereof. The planar shape of each of the notches 41 is a triangle wherein each side thereof has a length of 5 mm, but is not particularly limited. The size thereof is not particularly limited if the position thereof can be recognized. The method for making the notches 41 may be, for example, a punching method by use of a Thomson blade.

The specific embodiments and examples described in the item "DESCRIPTION OF THE EMBODIMENTS" are merely embodiments and examples for making the technical content of the present invention clear. Thus, the invention should not be interpreted in a narrow sense so as to be limited to such specific examples. The invention can be modified within the scope of the spirit of the invention and the following claims.

What is claimed is:

1. A method for fixing a chip-form work, using a dicing die-bonding film comprising a supporting substrate and a die-bonding adhesive layer formed on or over the supporting substrate, a mark for recognizing the position of the die-bonding adhesive layer being arranged at a given position of the film, which comprises:

the step of pressing and bonding a work onto the die-bonding adhesive layer of the dicing die-bonding film, the step being a step of recognizing the mark to detect information on the position of the die-bonding adhesive layer, correcting, if a positional slippage is present between the die-bonding adhesive layer and the work on the basis of the position information, the positional slippage, and then pressing and bonding the die-bonding adhesive layer and the work, the step of dicing the work into the chip-form work, the step of peeling the chip-form work together with the die-bonding adhesive layer from the supporting substrate, and the step of sticking/fixing the chip-form work through the die-bonding adhesive layer to a semiconductor element.

2. The method of claim 1, wherein the dicing die-bonding film comprises pressure-sensitive adhesive layer formed between the supporting substrate and the die-bonding adhesive layer, and where said step of peeling the chip-form work together with the die-bonding adhesive comprises peeling the chip-form work together with the die-bonding adhesive layer from the pressure-sensitive adhesive layer.

3. The method of claim 2, wherein the mark is arranged on a portion of the supporting substrate for the pressure-sensitive adhesive layer on which the die-bonding adhesive layer is not formed.

4. The method of claim 3, wherein the mark is arranged at a position to which a work and a mount frame are not attached.

5. The method of claim 3, wherein the mark is arranged at a position remaining after a mount frame is formed.

6. The method of claim 1, wherein one or more of the marks are arranged at given positions on a straight line.

7. The method of claim 2, wherein the peelability of the interface between the pressure-sensitive adhesive layer and the die-bonding adhesive layer is different between an interface face (A) corresponding to a work-attaching area (a) of the die-bonding adhesive layer and an interface (B) corresponding to a portion or the entire portion of other area (b) than the area (a), and the peelability of the interface (A) is larger than that of the interface (B).

8. The method of claim 7, wherein the adhesive force of the pressure-sensitive adhesive layer to the die-bonding adhesive layer is different between a pressure-sensitive adhesive layer portion (a) corresponding to the work-attaching area (a) of the die-bonding adhesive layer and a pressure-sensitive adhesive layer portion (b) corresponding to a portion or the entire portion of the other area (b), and the adhesive force of the pressure-sensitive adhesive layer portion (a) is smaller than that of the pressure-sensitive adhesive layer portion (b).

9. The method of claim 8, wherein the adhesive force of the work-attaching area (a) of the die-bonding adhesive layer to a work is larger than the adhesive force of the work-attaching area (a) to the pressure-sensitive adhesive layer portion (a).

10. The method of claim 7, wherein a portion of the area (b) other than the work-attaching area (a) is a mount-frame-attaching area.

11. The method of claim 10, wherein the adhesive force of the mount-frame-attaching area of the die-bonding adhesive layer to a mount frame is smaller than the adhesive force of the mount-frame-attaching area to an adhesive layer portion (b').

12. The method of claim 2, wherein the die-bonding adhesive layer is fitted, as a work-attaching area, to a portion of the pressure-sensitive adhesive layer, the adhesive force of the pressure-sensitive adhesive layer is different between a pressure-sensitive adhesive layer portion (a) corresponding to a work-attaching area (a) and a pressure-sensitive adhesive layer portion (b) other than the portion (a), and the adhesive force of the pressure-sensitive adhesive layer portion (a) is smaller than that of the pressure-sensitive adhesive layer portion (b).

13. The method of claim 12, wherein the adhesive force of the work-attaching area (a) to a work is larger than that of the area (a) to the adhesive layer area (a).

14. The method of claim 8, wherein the pressure-sensitive adhesive layer is made of a radial ray curable adhesive, and a pressure-sensitive adhesive layer area (a) corresponding to the work-attaching area (a) is irradiated with a radial ray.

15. The method of claim 1, wherein the mark is arranged on a portion of the supporting substrate on which the die-bonding adhesive layer is not formed.

16. The method of claim 15, wherein the mark is arranged at a position to which a work and a mount frame are not attached.

17. A semiconductor device wherein a chip-form work is stuck/fixed through a die-bonding adhesive layer to a semiconductor element by a method for fixing the chip-form work, using a dicing die-bonding film comprising a supporting substrate and the die-bonding adhesive layer formed on or over the supporting substrate, a mark for recognizing the position of the die-bonding adhesive layer being arranged at a given position of the film, the method comprising:

the step of pressing and bonding a work onto the die-bonding adhesive layer of the dicing die-bonding film, the step being a step of recognizing the mark to detect information on the position of the die-bonding adhesive layer, correcting, if a positional slippage is present between the die-bonding adhesive layer and the work on the basis of the position information, the positional slippage, and then pressing and bonding the die-bonding adhesive layer and the work, the step of dicing the work into the chip-form work, the step of peeling the chip-form work together with the die-bonding adhesive layer from the pressure-sensitive adhesive layer, and the step of sticking/fixing the chip-form work through the die-bonding adhesive layer to the semiconductor element.

18. The semiconductor device of claim 17, wherein the dicing die-bonding film comprises pressure-sensitive adhesive layer formed between the supporting substrate and the die-bonding adhesive layer, and where said step of peeling the chip-form work together with the die-bonding adhesive comprises peeling the chip-form work together with the die-bonding adhesive layer from the pressure-sensitive adhesive layer.

* * * * *

UNITED STATES PATENT AND TRADEMARK OFFICE
CERTIFICATE OF CORRECTION

PATENT NO. : 7,429,522 B2
APPLICATION NO. : 11/947727
DATED : September 30, 2008
INVENTOR(S) : Takeshi Matsumura et al.

It is certified that error appears in the above-identified patent and that said Letters Patent is hereby corrected as shown below:

At Column 4, Line 23, before "adhesive" please delete --is--.

At Column 6, Line 64, after "adhesive" please delete --is--.

At Column 10, Lines 27-30, please delete "The amount of the photopolymerization initiator to be blended is, for example, from about 0.05 to 20 parts by weight for 100 parts by weight of the acrylic polymer or the like which constitutes the adhesive as a base polymer.".

At Column 10, Line 26, after "acylphosphonates." please insert --The amount of the photopolymerization initiator to be blended is, for example, from about 0.05 to 20 parts by weight for 100 parts by weight of the acrylic polymer or the like which constitutes the adhesive as a base polymer.-- as the continuation of the same paragraph.

At Column 10, Line 41, after "cross" please delete "is".

At Column 14, Lines 7-14, after "2b." please delete "The pressure-sensitive adhesive layer 2 may be designed to have 2a and 2b in such a manner that the adhesive force of a portion 2a corresponding to the work-attaching area 3a and that of other portion 2b than the portion 2a satisfy the following relationship: the adhesive force of the pressure-sensitive adhesive layer portion 2a is smaller than that of the pressure-sensitive adhesive layer portion 2b.".

At Column 14, Line 8, please insert --The pressure-sensitive adhesive layer 2 may be designed to have 2a and 2b in such a manner that the adhesive force of a portion 2a corresponding to the work-attaching area 3a and that of other portion 2b than the portion 2a satisfy the following relationship: the adhesive force of the pressure-sensitive adhesive layer portion 2a is smaller than that of the pressure-sensitive adhesive layer portion 2b.-- as a new paragraph.

At Column 14, Lines 14-36, after 2b, please delete "The adhesive used to form the pressure-sensitive adhesive layer 2 illustrated in FIGS. 2 to 4 is not limited to any especial kind. The adhesive is preferably a radial ray curable adhesive capable of making a difference between the adhesive force of the pressure-sensitive adhesive layer

UNITED STATES PATENT AND TRADEMARK OFFICE
CERTIFICATE OF CORRECTION

PATENT NO. : 7,429,522 B2
APPLICATION NO. : 11/947727
DATED : September 30, 2008
INVENTOR(S) : Takeshi Matsumura et al.

It is certified that error appears in the above-identified patent and that said Letters Patent is hereby corrected as shown below:

portion 2a and that of the pressure-sensitive adhesive layer portion 2b easily. About the radial ray curable adhesive, the adhesive force thereof can easily be lowered by an increase in the crosslinking degree thereof by irradiation with radial rays such as ultraviolet rays. Accordingly, the adhesive force of the pressure-sensitive adhesive layer portion 2a can easily be made remarkably lower by curing the radial ray curable adhesive layer in accordance with the work-attaching area 3a. Since the adhesive layer 3 or 3a is attached to the cured pressure-sensitive adhesive layer portion 2a, the adhesive force of which is lowered, the interface between the pressure-sensitive adhesive layer portion 2a and the adhesive layer area 3a has a property that the portion 2a and the area 3a are easily peeled therein from each other when the semiconductor chip is picked up. On the other hand, the portion which is irradiated with no radial ray has a sufficient adhesive force, so as to constitute the pressure-sensitive adhesive layer portion 2b.".

At Column 14, Line 15, please insert --The adhesive used to form the pressure-sensitive adhesive layer 2 illustrated in FIGS. 2 to 4 is not limited to any especial kind. The adhesive is preferably a radial ray curable adhesive capable of making a difference between the adhesive force of the pressure-sensitive adhesive layer portion 2a and that of the pressure-sensitive adhesive layer portion 2b easily. About the radial ray curable adhesive, the adhesive force thereof can easily be lowered by an increase in the crosslinking degree thereof by irradiation with radial rays such as ultraviolet rays. Accordingly, the adhesive force of the pressure-sensitive adhesive layer portion 2a can easily be made remarkably lower by curing the radial ray curable adhesive layer in accordance with the work-attaching area 3a. Since the adhesive layer 3 or 3a is attached to the cured pressure-sensitive adhesive layer portion 2a, the adhesive force of which is lowered, the interface between the pressure-sensitive adhesive layer portion 2a and the adhesive layer area 3a has a property that the portion 2a and the area 3a are easily peeled therein from each other when the semiconductor chip is picked up. On the other hand, the portion which is irradiated with no radial ray has a sufficient

UNITED STATES PATENT AND TRADEMARK OFFICE
CERTIFICATE OF CORRECTION

PATENT NO. : 7,429,522 B2
APPLICATION NO. : 11/947727
DATED : September 30, 2008
INVENTOR(S) : Takeshi Matsumura et al.

It is certified that error appears in the above-identified patent and that said Letters Patent is hereby corrected as shown below:

adhesive force, so as to constitute the pressure-sensitive adhesive layer portion 2b.-- as a new paragraph.

At Column 14, Lines 49-61, after "others." please delete "The pressure-sensitive adhesive layer 2 is formed to make the adhesive force of the pressure-sensitive adhesive layer portion 2a smaller than that of the pressure-sensitive adhesive layer portion 2b. In each of the dicing die-bonding films 6 and 7 illustrated FIGS. 2 and 3, the peelability of the interface (A) is made larger than that of the interface (B) regarding the adhesive force to the adhesive layer 3. In the dicing die-bonding film 8 as illustrated in FIG. 4, the adhesive force of the pressure-sensitive adhesive layer portion 2a is made smaller than that of the pressure-sensitive adhesive layer portion 2b in connection with, for example, a SUS 304 plate (#2000 polished) as an object tot which a chip is to be stuck/fixed.".

At Column 14, Line 50, please insert --The pressure-sensitive adhesive layer 2 is formed to make the adhesive force of the pressure-sensitive adhesive layer portion 2a smaller than that of the pressure-sensitive adhesive layer portion 2b. In each of the dicing die-bonding films 6 and 7 illustrated FIGS. 2 and 3, the peelability of the interface (A) is made larger than that of the interface (B) regarding the adhesive force to the adhesive layer 3. In the dicing die-bonding film 8 as illustrated in FIG. 4, the adhesive force of the pressure-sensitive adhesive layer portion 2a is made smaller than that of the pressure-sensitive adhesive layer portion 2b in connection with, for example, a SUS 304 plate (#2000 polished) as an object tot which a chip is to be stuck/fixed.-- as a new paragraph.

At Column 16, Lines 60-65, please delete "For example, an embodiment wherein only a given area of an adhesive layer is colored and the area is used as a mark can be adopted instead of the embodiment using the colored layer. FIG. 5 is a sectional view which schematically illustrates a dicing die-bonding film 11 according to the present embodiment.".

UNITED STATES PATENT AND TRADEMARK OFFICE
CERTIFICATE OF CORRECTION

PATENT NO.       : 7,429,522 B2
APPLICATION NO.  : 11/947727
DATED            : September 30, 2008
INVENTOR(S)      : Takeshi Matsumura et al.

It is certified that error appears in the above-identified patent and that said Letters Patent is hereby corrected as shown below:

At Column 16, Line 59, after "case." please insert --For example, an embodiment wherein only a given area of an adhesive layer is colored and the area is used as a mark can be adopted instead of the embodiment using the colored layer. FIG. 5 is a sectional view which schematically illustrates a dicing die-bonding film 11 according to the present embodiment.-- as the continuation of the same paragraph.

At Column 17, Lines 15-23 (approximately), please delete "Preferable examples of the leuco dye include conventional triphenylmethane type, fluoran type, phenothiazine type, auramine type, and spiropyran type dyes. Specific examples thereof includes 3-[N-(p-tolylamino)]-7-anilinofluoran, 3-[N-(p-tolyl)-N-methylamino]-7-anilinofluoran, 3-[N-(p-tolyl)-N-ethylamino]-7-anilinofloran, 3-diethylamino-6-methyl-7-anilinofluoran, crystal violet lactone, 4,4',4"-trisdimethylaminotriphenylmethanol, and 4,4',4"-trisdimethylaminotriphenylmethane.".

UNITED STATES PATENT AND TRADEMARK OFFICE
CERTIFICATE OF CORRECTION

PATENT NO. : 7,429,522 B2
APPLICATION NO. : 11/947727
DATED : September 30, 2008
INVENTOR(S) : Takeshi Matsumura et al.

It is certified that error appears in the above-identified patent and that said Letters Patent is hereby corrected as shown below:

At Column 17, Line 14, after "dye." please insert --Preferable examples of the leuco dye include conventional triphenylmethane type, fluoran type, phenothiazine type, auramine type, and spiropyran type dyes. Specific examples thereof includes 3-[N-(p-tolylamino)]-7-anilinofluoran, 3-[N-(p-tolyl)-N-methylamino]-7-anilinofluoran, 3-[N-(p-tolyl)-N-ethylamino]-7-anilinofloran, 3-diethylamino-6-methyl-7-anilinofluoran, crystal violet lactone, 4,4',4"-trisdimethylaminotriphenylmethanol, and 4,4',4"-trisdimethylaminotriphenylmethane.-- as the continuation of the same paragraph.

Signed and Sealed this

Fifteenth Day of December, 2009

David J. Kappos
*Director of the United States Patent and Trademark Office*